(12) United States Patent
Mauer

(10) Patent No.: US 12,111,193 B2
(45) Date of Patent: Oct. 8, 2024

(54) METHOD FOR DETERMINING A TARGET VOLUMETRIC FLOW RATE FOR A COOLANT

(71) Applicant: Robert Bosch GmbH, Stuttgart (DE)

(72) Inventor: Jakob Mauer, Sachsenheim (DE)

(73) Assignee: Robert Bosch GmbH, Stuttgart (DE)

( * ) Notice: Subject to any disclaimer, the term of this patent is extended or adjusted under 35 U.S.C. 154(b) by 335 days.

(21) Appl. No.: 17/770,791

(22) PCT Filed: Sep. 23, 2020

(86) PCT No.: PCT/EP2020/076534
§ 371 (c)(1),
(2) Date: Apr. 21, 2022

(87) PCT Pub. No.: WO2021/078457
PCT Pub. Date: Apr. 29, 2021

(65) Prior Publication Data
US 2022/0373374 A1    Nov. 24, 2022

(30) Foreign Application Priority Data

Oct. 22, 2019 (DE) .................... 10 2019 216 218.5

(51) Int. Cl.
*G01F 1/68* (2006.01)
*H05K 7/20* (2006.01)
(52) U.S. Cl.
CPC ........... *G01F 1/68* (2013.01); *H05K 7/20927* (2013.01); *H05K 7/20945* (2013.01)

(58) Field of Classification Search
CPC ... G01F 1/68; H05K 7/20927; H05K 7/20945
See application file for complete search history.

(56) References Cited

U.S. PATENT DOCUMENTS 5,268,630 A * 12/1993 Bhagwat ........... H02J 7/007184
320/145
6,450,275 B1 * 9/2002 Gabriel .................... B60K 6/22
165/41
(Continued)

FOREIGN PATENT DOCUMENTS

DE    112013000188 T5    6/2015
DE    102016212192 A1    1/2018
(Continued)

OTHER PUBLICATIONS

Translation of International Search Report for Application No. PCT/EP2020/076534 dated Dec. 3, 2020 (2 pages).

*Primary Examiner* — Christopher W Carter
(74) *Attorney, Agent, or Firm* — Michael Best & Friedrich LLP

(57) ABSTRACT

The invention relates to a method for determining a target volumetric flow rate (V) for a coolant that is conducted through a coolant path in order to cool a power converter, wherein: the temperature ($T_C$) of a DC-link capacitor of the power converter and the temperature ($T_K$) of the coolant are determined, and a value for the target volumetric flow rate (V) is determined on the basis of the temperature ($T_C$) of the DC-link capacitor and the temperature ($T_K$) of the coolant.

8 Claims, 3 Drawing Sheets

(56) References Cited

U.S. PATENT DOCUMENTS

| | | | |
|---|---|---|---|
| 2009/0289583 A1* | 11/2009 | Yoshida | H02K 9/18 |
| | | | 903/906 |
| 2013/0285486 A1* | 10/2013 | Imanishi | H02M 1/32 |
| | | | 310/53 |
| 2014/0000860 A1* | 1/2014 | Nishizawa | B60H 1/32 |
| | | | 165/202 |
| 2017/0219441 A1* | 8/2017 | Doppelhammer | H02M 5/458 |

FOREIGN PATENT DOCUMENTS

| | | |
|---|---|---|
| EP | 2907688 A1 | 8/2015 |
| WO | 2020156818 A1 | 8/2020 |

* cited by examiner

METHOD FOR DETERMINING A TARGET VOLUMETRIC FLOW RATE FOR A COOLANT

BACKGROUND OF THE INVENTION

The present invention relates to a method for determining a target volumetric flow rate for a coolant which is conducted through a coolant path to cool a power converter, and a processing unit and a computer program for carrying out the method.

Electrical machines, in particular during use in a vehicle, in particular a hybrid vehicle or electric vehicle, can be operated by means of a power converter. In particular, a motor mode and a generator mode are possible for this purpose. Because of the heat arising in this case due to power loss in the power converter, in particular the semiconductor switching elements or power semiconductors therein, it is expedient to cool such power converters by means of a coolant, for example water.

SUMMARY OF THE INVENTION

According to the invention, a method for determining a target volumetric flow rate and a processing unit and a computer program for carrying out the method having the features of the independent claims are proposed. Advantageous embodiments are the subject matter of the dependent claims and the following description.

The invention relates to a method for determining a target volumetric flow rate for a coolant which is conducted through a coolant path to cool a power converter. Such a power converter can be in particular an inverter. As already mentioned, such a power converter typically has semiconductor switching elements, in particular power semiconductors such as MOSFETs or IGBTs, to convert a voltage, for example, from a DC voltage into an AC voltage and vice versa. Depending on the type of the electrical machine to be activated by means of the power converter and also of the power converter itself, in particular in the case of high powers overall, i.e., high currents, strong heating of the semiconductor switching elements and thus of the power converter can occur due to corresponding power loss.

Such an electrical machine can be used in particular in a vehicle, in particular in a hybrid or (solely) electric vehicle.

In such a power converter or in general in power electronics, a cooling device or an option for cooling is therefore typically provided. For example, a heat sink can be used for this purpose, on which the semiconductor switching elements and possibly other relevant components are arranged, and along which a coolant is guided in a coolant path to dissipate the occurring heat. The coolant can be in particular a liquid, for example, water or a water-glycol mixture. The heat sink can have cooling ribs or the like which are located in the coolant path to be able to dissipate the occurring heat as efficiently as possible.

For targeted activation, which is as effective as possible, of a corresponding coolant pump, by means of which the coolant is pumped or conducted along the coolant path, knowledge about a required volumetric flow rate of the coolant, thus a target volumetric flow rate, is required. On the one hand, this is because the power converter is not to exceed a certain temperature, i.e., it is to be protected from overheating, for which purpose a sufficiently high volumetric flow rate is necessary, on the other hand, however, it is also undesirable to provide an unnecessarily high volumetric flow rate of the coolant, for which purpose unnecessary energy would be required for the operation of the coolant pump.

To determine a suitable target volumetric flow rate, it is possible to determine a temperature of the semiconductor switching elements or the heat generated thereby which is to be dissipated. A suitable target volumetric flow rate can be determined therefrom. However, it has been shown that a particularly accurate determination of a target volumetric flow rate for the coolant is also possible by considering a DC-link capacitor of the power converter and its temperature.

In the proposed method, a temperature of the DC-link capacitor of the power converter and a temperature of the coolant are therefore determined. The temperature of the DC-link capacitor can be measured, for example, by means of a corresponding temperature sensor directly at the DC-link capacitor (or modeled). The temperature of the coolant can be measured, for example, by means of a temperature sensor at an inlet of the coolant path (or modeled). However, measuring the temperature of the coolant at another suitable point in the coolant circuit is also conceivable, but preferably upstream and in particular in the vicinity of the coolant path of the power converter.

A value for the target volumetric flow rate is then determined based on the temperature of the DC-link capacitor and the temperature of the coolant. The latter is preferably carried out in that firstly a temperature difference is determined between the temperature of the DC-link capacitor and the temperature of the coolant and then based on the temperature difference and the temperature of the coolant, the value for the target volumetric flow rate is determined. A coolant pump for the coolant is then expediently activated or regulated based on the determined target volumetric flow rate. The target volumetric flow rate for the semiconductors, for example, can be a separate function and thus independent of the capacitor. Nonetheless, the target volumetric flow rate for the power converter or inverter is a max function of capacitor, semiconductors, and other temperature models.

On the basis of the temperature difference between the temperatures of the DC-link capacitor—it can be a film capacitor in particular here—and coolant, it can be determined particularly easily how high a volumetric flow rate of the coolant has to be or should be to be able to also dissipate heat to be dissipated. The temperature difference indicates here how much heat is to be dissipated, the temperature of the coolant indicates how much heat the coolant can still absorb. Coolant which is already very hot can thus generally absorb—and dissipate—less heat (per unit of volume or mass) than a colder coolant. Correspondingly, the volumetric flow rate is to be higher in the case of a hotter coolant than in the case of a cold coolant.

The determination of the target volumetric flow rate can be carried out here—starting from the temperature difference between the temperature of the DC-link capacitor and the temperature of the coolant, on the one hand, and the temperature of the coolant, on the other hand—in particular on the basis of a characteristic map. Suitable values for the target volumetric flow rate can be stored in each case therein, for example, for various values of the two mentioned variables. These can have been determined beforehand in the context of test measurements and/or simulations.

It is particularly preferable if at least one value of a current in the power converter is determined. From the temperature of the DC-link capacitor and the temperature of the coolant (or the temperature difference and the temperature of the coolant), an intermediate value for the target volumetric flow rate can then initially be determined or ascertained, in particular on the basis of the above-mentioned characteristic map, which is then adapted, in particular scaled, based on the at least one value of the current, and is then used as the value for the target volumetric flow rate.

In particular a value of a current in a DC link of the power converter and/or a value of a phase current comes into consideration here as the at least one value of the current in the power converter. Both the current in the DC link and also the phase current are variables which characterize a present operating status of the power converter, in particular with respect to the present power loss and thus the occurring heat to be dissipated. This also applies in particular, however, to a future development of the occurring heat to be dissipated. This is because if the currents are only minor, it can be presumed that the occurring heat to be dissipated will decrease. The target volumetric flow rate can therefore also be selected to be less. Correspondingly, in the event of high currents, the target volumetric flow rate can be selected to be higher or not as low. The efficiency of the cooling can thus be further increased, up to the goal of turning off the coolant pump entirely at least temporarily, for example, in the case of a non-active power converter, and thus saving energy and reducing emissions.

The determination of the target volumetric flow rate or a present value for it is expediently carried out repeatedly, in particularly regularly, at defined time intervals. It is then preferred here if a time interval between two successive determinations of the value for the target volumetric flow rate is predefined as a function of a change of a current in the power converter. In particular one of the two above-mentioned currents, namely the current in the DC link or the phase current, can be used as the current in the power converter. A use of both currents is also conceivable, wherein then both can be observed and one of them can be selected depending on the situation.

It is expedient for this purpose if upon an increase of the current (thus a positive gradient) in the power converter, a longer time interval is predefined than upon a decrease of the current (thus a negative gradient) in the power converter. In this way, possible disadvantageous thermal effects can be prevented from occurring, for example, reheating can be avoided. The heating generally takes place somewhat faster than the cooling, because of which these are to be distinguished between. In order that an excessively strong reheating effect does not occur, the volumetric flow rate is expediently changed slowly during the cooling, while a higher volumetric flow rate is to be requested relatively promptly during heating.

A processing unit according to the invention, for example, a controller of a motor vehicle or a control unit or a power electronics unit of an electrical machine is configured, in particular by programming, to carry out a method according to the invention.

The implementation of a method according to the present invention in the form of a computer program or computer program product having program code for carrying out all method steps is also advantageous, since this causes particularly low costs, in particular if an executing controller is also used for further tasks and is therefore provided in any case. Suitable data carriers for providing the computer program are in particular magnetic, optical, and electrical memories, e.g., hard drives, flash memories, EEPROMs, DVDs, etc. A download of a program via computer networks (Internet, intranet, etc.) is also possible.

Further advantages and embodiments of the invention result from the description and the appended drawing.

The invention is schematically illustrated in the drawing on the basis of an exemplary embodiment and is described hereinafter with reference to the drawing.

DETAILED DESCRIPTION

Figure 1:
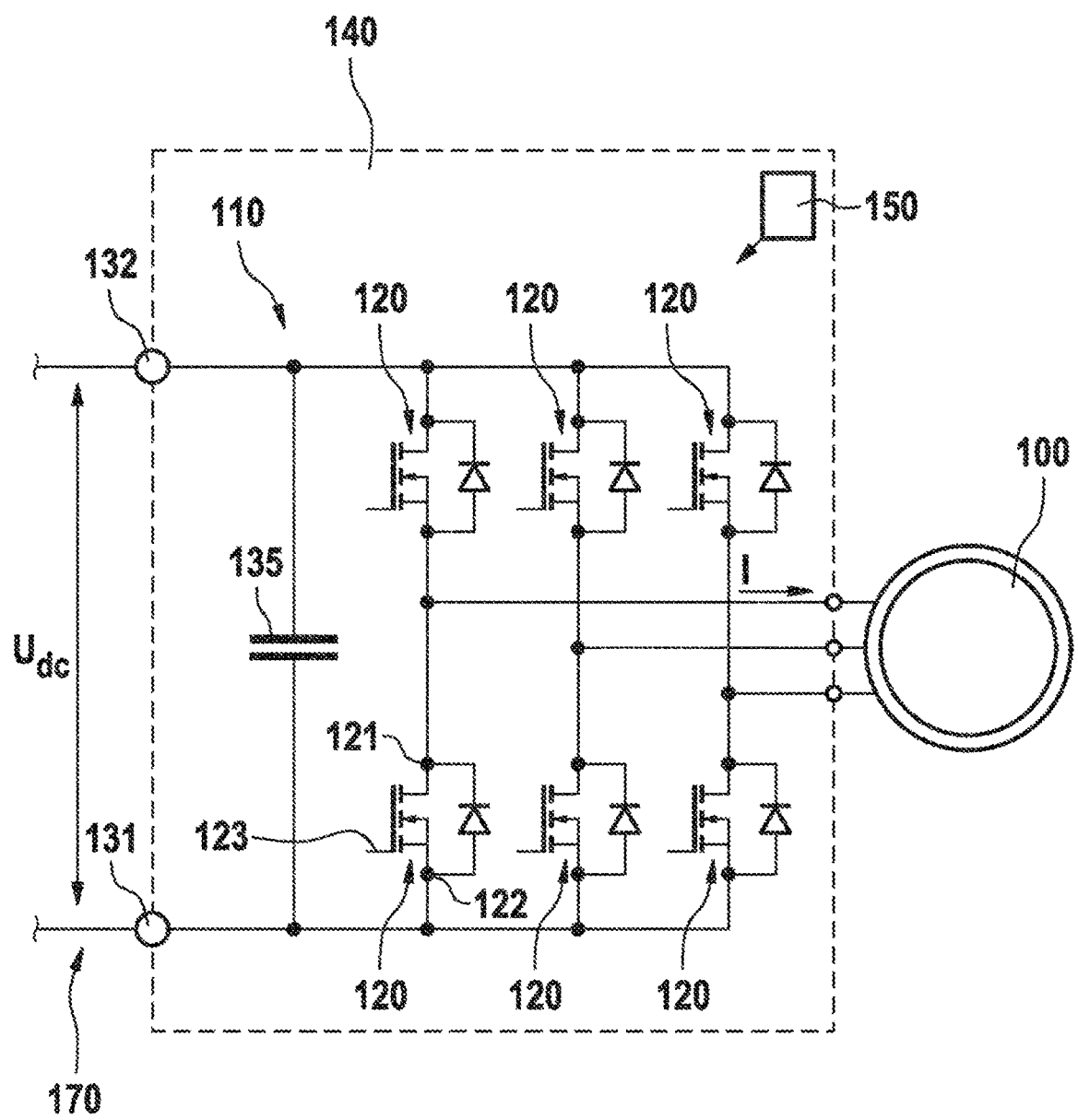
FIG. 1 schematically shows a power converter, in which a method according to the invention can be carried out.

A power converter 110, designed by way of example as a B6 bridge, is schematically illustrated in FIG. 1, in which a method according to the invention can be carried out and which is used to activate an electrical machine 100.

The power converter 110 has two DC voltage terminals 131, 132, which are connected in a typical manner, in addition to a DC-link capacitor 135, designed, for example, as a film capacitor, to, for example, six semiconductor switching elements 120, for example, MOSFETs or IGBTs. A phase (stator winding) of the electrical machine 100 is connected between each two of the semiconductor switching elements 120.

It is to be noted at this point that the power converter can be operated not only as an inverter, but also as a rectifier, so that the electrical machine is operable overall both as a motor and also as a generator.

Furthermore, the power converter 110 is connected with its DC voltage terminals 131, 132 to a vehicle electrical system 170, for example in a vehicle. Further components or consumers are in turn typically connected to the vehicle electrical system 170, which are not shown here for the sake of clarity, however.

During operation of the power converter 110, the individual semiconductor switching elements 120 are activated by means of an activation circuit or an activation unit 150 in a suitable manner to open or close. This is carried out, for example, at a defined clock frequency. In a typical activation, for example, one switch is always closed and the other is open for each branch. A DC voltage $U_{dc}$ is converted into an AC voltage, so that a phase current I flows in the phases.

The power converter 110 and optionally the activation unit 150 can together form a power electronics unit 140 for the electrical machine 100 or can be part of such a power electronics unit. In particular, a measurement of a current or current flow and a voltage in the power converter can also take place.

Figure 2:
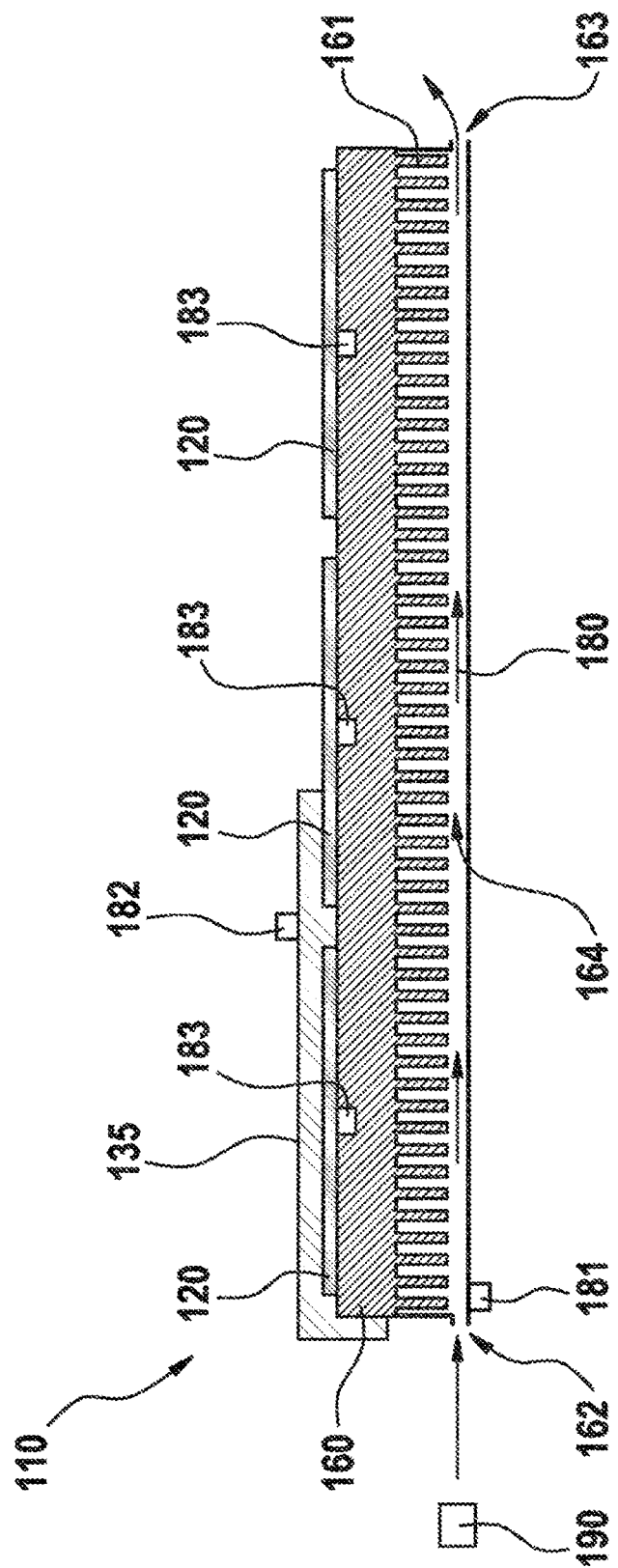
FIG. 2 shows the power converter from FIG. 1 in another representation.

In FIG. 2, the power converter 110 from FIG. 1 is shown in another representation, in a sectional view. In particular, a heat sink 160 having a plurality of cooling ribs 161 is additionally shown here, on the surface of which the semiconductor switching elements 120 are arranged or attached (in this view only one semiconductor switching element per phase is visible). A good heat transfer from the semiconductor switches 120 to the heat sink 160 can be achieved by a suitable attachment of the semiconductor switching elements 120 on the heat sink 160. Moreover, the DC-link capacitor 135 is shown, which can also be arranged on the heat sink 160 to enable effective cooling.

Furthermore, a coolant path 164 is shown, which is delimited, for example, by a suitable housing on the side of the heat sink 160 opposite to the semiconductor switching elements 120, so that in particular the cooling ribs 161 are also located therein. The coolant path 164 has an inlet 162 and an outlet 163, so that coolant, for example, water, which is indicated by arrows 180, can enter through the inlet 162 and can exit again through the outlet 163. In this way, the heat can be emitted from the heat sink 160 to the coolant 180. A coolant pump, which is indicated, for example, by the reference sign 190, can be used to pump the coolant 180.

Furthermore, a temperature sensor 181 or 182 is respectively attached at both the inlet 162 of the coolant path and also at the DC-link capacitor 135, by which a temperature of the coolant 180 at the inlet 162 of the coolant path and a temperature of the DC-link capacitor 135 can be measured. Further temperature sensors 183 can be provided at the semiconductor switching elements 120.

Figure 3:
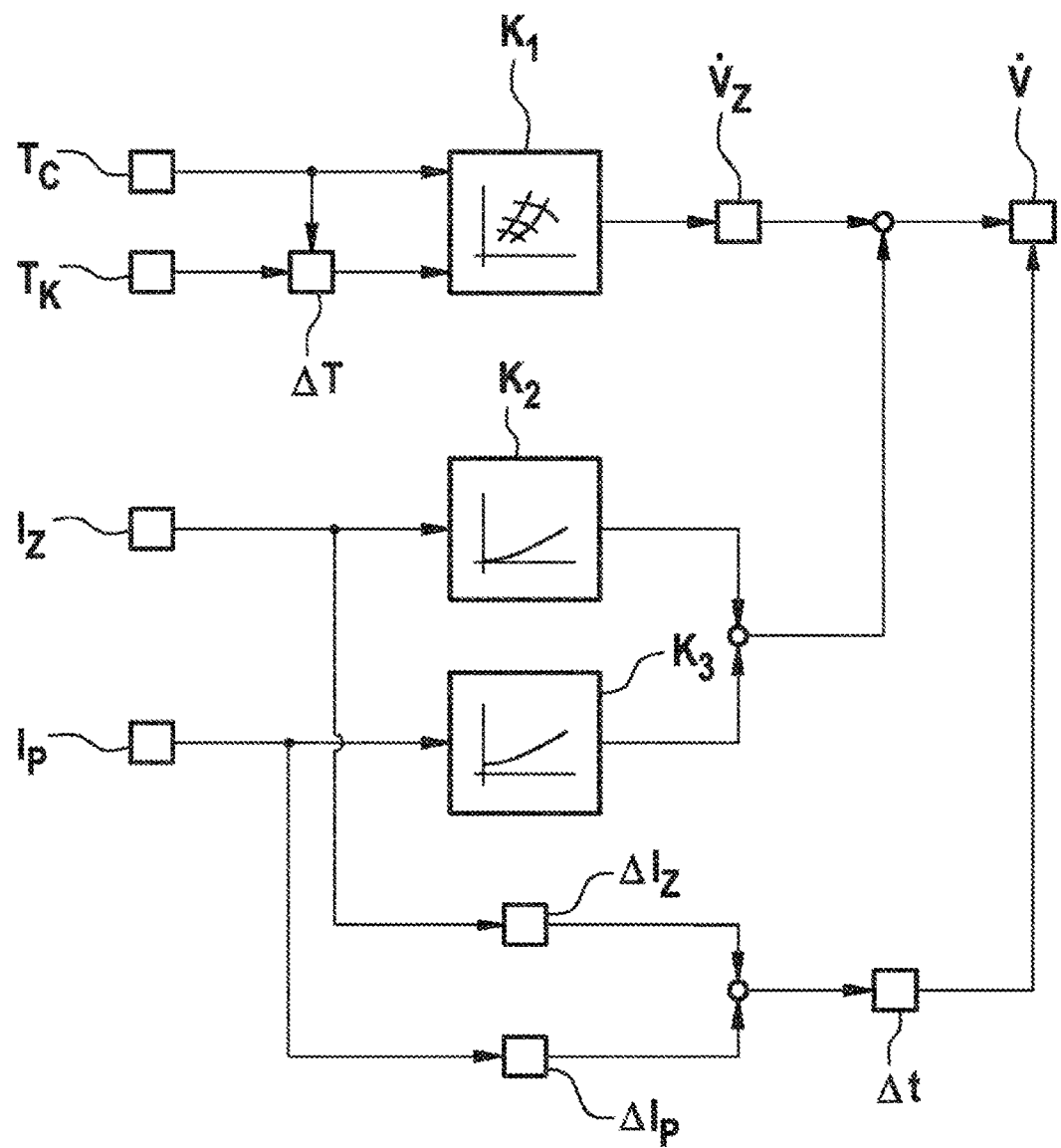
FIG. 3 schematically shows a sequence of a method according to the invention in a preferred embodiment.

A sequence of a method according to the invention in a preferred embodiment is schematically shown in FIG. 3. Firstly, the temperature $T_C$ of the DC-link capacitor and the temperature $T_K$ of the coolant are determined or measured, for example, by means of the temperature sensors mentioned with reference to FIG. 2.

A temperature difference $\Delta T$ can be formed from the temperature $T_C$ and the temperature $T_K$ according to the formula $\Delta T=T_C-T_K$. Based on the temperature difference $\Delta T$ and the temperature $T_K$ of the coolant, an intermediate value $V_Z$ of the target volumetric flow rate for the coolant can then be determined on the basis of a characteristic map $K_1$. For this purpose, the values stored in the characteristic map $K_1$ can have been determined, for example, on the basis of test measurements and/or simulations. It is also conceivable that the temperature difference is not explicitly determined or calculated, but rather the values stored in the characteristic map directly apply accordingly for the temperatures $T_C$ and $T_K$.

Furthermore, a current $I_Z$ in the DC link and/or a phase current $I_P$ is determined or measured by means of corresponding sensors or measuring units. A factor can then be determined in each case on the basis of a respective characteristic curve $K_1$ or $K_2$, by means of which the intermediate value $V_Z$ can be adapted, in particular scaled down. It is expedient here to use only one of the two factors, namely in particular the one which results in a higher target volumetric flow rate, to catch any uncertainties. In this way, the target volumetric flow rate V is determined, on the basis of which the coolant pump can be activated.

As already mentioned, this target volumetric flow rate can be determined regularly, to thus always obtain the presently required value for the target volumetric flow rate, in order to operate the coolant pump efficiently, and possibly also be able to switch it off temporarily. A change or a gradient $\Delta I_Z$ or $\Delta I_P$, respectively, can also be determined in this context for the current $I_Z$ in the DC link and/or the phase current $I_P$. If only one gradient is determined and it is positive, i.e., the current increases, a time interval $\Delta t$ between two successive determinations of the value for the target volumetric flow rate V can be set to a small value, otherwise to a large value.

A time interval is expediently predefined here via a time grid of the model used, for example, a call of the function can take place every 100 ms. For example, if a fixed torque and a fixed speed are used for driving, but at two different DC-link voltages, the gradient of the DC-link current changes, so that either less or more heat has to be dissipated. In the case of different signs, the max function engages, i.e., the greater value is used.

The invention claimed is:

1. A method for determining a target volumetric flow rate (V) for a coolant (180), which is conducted through a coolant path (164) to cool a power converter (110), the method comprising:
   determining a temperature (TC) of a DC-link capacitor (135) of the power converter (110) and a temperature (TK) of the coolant, and
   determining, via an electronic controller, a value for the target volumetric flow rate (V) based on the temperature (TC) of the DC-link capacitor and the temperature (TK) of the coolant, and
   wherein the value for the target volumetric flow rate (V) is determined based on a temperature difference ($\Delta T$), between the temperature (TC) of the DC-link capacitor and the temperature (TK) of the coolant, and the temperature of the coolant (TK), and
   wherein at least one value of a current is determined in the power converter, and wherein based on the at least one value of the current, an intermediate value (VZ) for the target volumetric flow rate determined from the temperature (TC) of the DC-link capacitor and the temperature of the coolant (TK), is adapted via the electronic controller and used as the value for the target volumetric flow rate (V), and
   controlling flow of coolant, via a coolant pump (190), through the coolant path (164) at the target volumetric flow rate (V).

2. The method as claimed in claim 1, wherein (i) a value of a current (IZ) in a DC link of the power converter, (ii) a value of a phase current (IP), or both (i) and (ii) are used as the at least one value of the current in the power converter.

3. The method as claimed in claim 1, wherein a time interval ($\Delta t$) between two successive determinations of the value for the target volumetric flow rate (V) is predefined as a function of a change of a current in the power converter.

4. The method as claimed in claim 3, wherein upon an increase of the current in the power converter, a longer time interval is predefined than upon a decrease of the current in the power converter.

5. The method as claimed in claim 1, wherein the coolant pump (190) for the coolant (180) is activated based on the determined target volumetric flow rate (V).

6. The method as claimed in claim 1, wherein the target volumetric flow rate (V) is scaled based on the at least one value of the current.

7. The method as claimed in claim 1, wherein the value for the target volumetric flow rate (V) is determined based on a characteristic map (K1).

8. A non-transitory, computer-readable storage medium having instructions that when executed by a computer cause the computer to determine a target volumetric flow rate (V) for a coolant (180), which is conducted through a coolant path (164) to cool a power converter (110), by:
   determining a temperature (TC) of a DC-link capacitor (135) of the power converter (110) and a temperature (TK) of the coolant, and
   determining a value for the target volumetric flow rate (V) based on the temperature (TC) of the DC-link capacitor and the temperature (TK) of the coolant, and
   wherein the value for the target volumetric flow rate (V) is determined based on a temperature difference ($\Delta T$), between the temperature (TC) of the DC-link capacitor and the temperature (TK) of the coolant, and the temperature of the coolant (TK), and
   wherein at least one value of a current is determined in the power converter, and wherein based on the at least one value of the current, an intermediate value (VZ) for the target volumetric flow rate determined from the temperature (TC) of the DC-link capacitor and the temperature of the coolant (TK), is adapted based on a characteristic map (K1) and used as the value for the target volumetric flow rate (V), and controlling flow of coolant, via a coolant pump (190), through the coolant path (164) at the target volumetric flow rate (V).

\* \* \* \* \*